United States Patent
Chiu et al.

[11] Patent Number: 6,107,202
[45] Date of Patent: Aug. 22, 2000

[54] PASSIVATION PHOTORESIST STRIPPING METHOD TO ELIMINATE PHOTORESIST EXTRUSION AFTER ALLOY

[75] Inventors: Chih-Kang Chiu, Yung-Ho; Sheng-Liang Pan, Hsin-Chu, both of Taiwan

[73] Assignee: Taiwan Semiconductor Manufacturing Company, Hsin Chu, Taiwan

[21] Appl. No.: 09/152,349

[22] Filed: Sep. 14, 1998

[51] Int. Cl.[7] .................................................. H01L 21/308
[52] U.S. Cl. .......................... 438/690; 438/120; 438/618; 438/700; 438/750; 438/781; 438/906; 438/948; 438/963
[58] Field of Search ..................................... 438/690, 618, 438/700, 750, 781, 906, 948, 963, FOR 124, FOR 355, FOR 395, FOR 434, FOR 438, 120

[56] References Cited

U.S. PATENT DOCUMENTS

| | | |
|---|---|---|
| 3,988,256 | 10/1976 | Vandermay et al. .................. 252/171 |
| 4,067,100 | 1/1978 | Kojima . |
| 4,165,294 | 8/1979 | Vander . |
| 4,567,132 | 1/1986 | Fredericks . |
| 4,786,578 | 11/1988 | Neisius et al. .......................... 430/256 |
| 4,824,762 | 4/1989 | Kobayashi et al. ..................... 430/258 |
| 5,201,960 | 4/1993 | Strarar ....................................... 134/11 |
| 5,362,608 | 11/1994 | Flaim et al. ............................ 430/327 |
| 5,688,618 | 11/1997 | Hulderman . |
| 5,904,156 | 5/1999 | Advocate . |
| 6,000,411 | 12/1999 | Lee . |
| 6,002,202 | 12/1999 | Meyer . |

OTHER PUBLICATIONS

W.M. Moreau, Semiconductor Lithography Principles, Practices and Materials, Plenum Press, 1988, pp. 779–788.

*Primary Examiner*—George Fourson
*Attorney, Agent, or Firm*—George O. Saile; Stephen B. Ackerman; William J. Stoffel

[57] ABSTRACT

A method for stripping positive photoresist from a keyhole 17 in a passivation layer 18 before a heating process using NMP solvent strips after a photoresist strip. The process is summarized by the 5 steps as follows: (1) Photoresist strip 1 (e.g., EKC 830), (2) Photoresist strip 2 (e.g., EKC 830 photoresist stripper), (3) N-methly-2-pyrolidone (NMP) solvent strip-agitated (solvent is preferably the same solvent in the photoresist stripper (1 &2) (4) NMP solvent strip-agitated and (5) $H_2O$ rinse. The NMP solvent strip steps (3) and (4) remove photoresist residue (16, FIG. 1) in the key hole 17. This prevents the formation of photoresist extrusions 24 while annealing the metal lines 14.

16 Claims, 2 Drawing Sheets

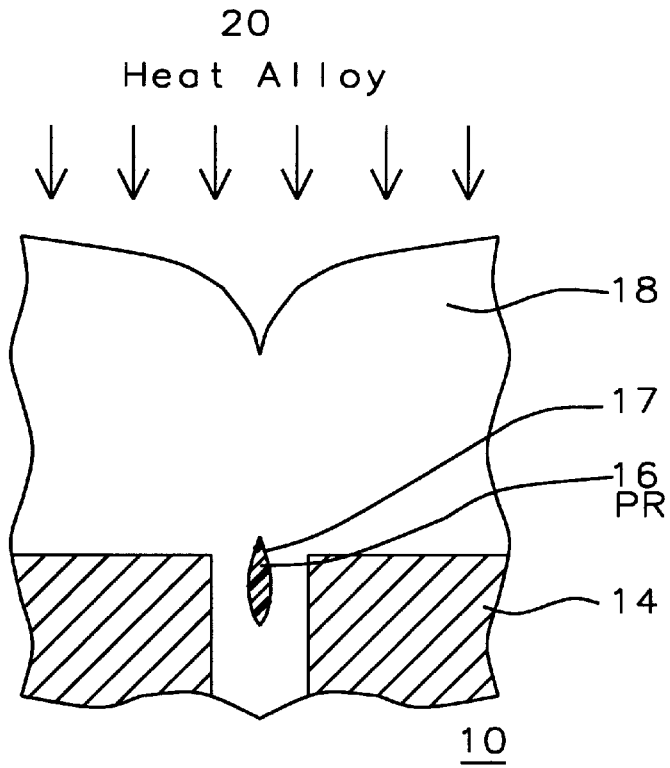
FIG. 1 – Prior Art
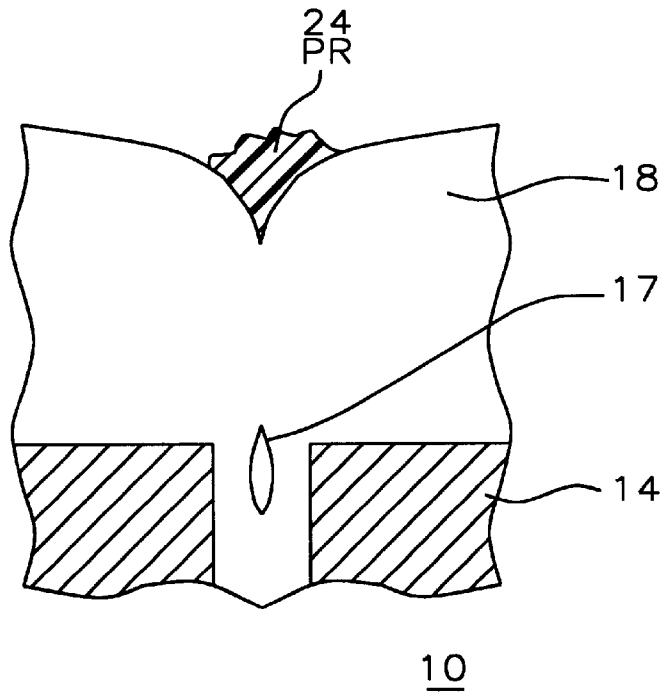
FIG. 2 – Prior Art

PASSIVATION PHOTORESIST STRIPPING METHOD TO ELIMINATE PHOTORESIST EXTRUSION AFTER ALLOY

BACKGROUND OF INVENTION

1) Field of the Invention

This invention relates generally to the removal of photoresist or stripping of photoresist in semiconductor manufacturing and more particularly to removal of photoresist residue from a keyhole in a passivation layer before a heating process using a stripping solution preferably comprising N-methyl-2-pyrrolidone (NMP).

2) Description of the Prior Art

The fabrication of integrated circuits and other devices on semiconductor wafers depends on the photolithographic patterning of successive layers of materials applied on and into the wafer. In each photolithographic step, a layer of photoresist is applied to the wafer, soft baked, and patterned by exposure to radiation through a precisely aligned mask. Such exposure alters the solubility of the resist material in a particular solvent, thus allowing selective removal of the resist in accordance with the pattern deemed by the mask. In this way, a precisely patterned protective layer is formed over the semiconductor wafer to limit subsequent fabrication steps to exposed locations on the wafer.

When the photoresist material becomes highly cross-linked, it begins to behave as a gel. When the cross-linking approaches 100% (unity), the resist is no longer soluble in any solvent and instead will only swell when exposed to even the strongest solvent for the starting polymer material.

In addition to cross-linking, contamination of a photoresist layer during a wafer fabrication step can also reduce its solubility. For example, when photoresist is used for patterning a silicon dioxide or aluminum layer during plasma etching, the organic photoresist material may become contaminated by silicon, aluminum, or other inorganic material. Such contaminated photoresists are frequently refractory to normal solvent removal.

Alternative removal techniques for refractory photoresists include several rigorous and often harsh processes. For example, thermal and photochemical oxidation of the photoresists have been employed. While generally effective, to assure sufficiently rapid processing, such oxidation requires elevated temperatures, typically in the range from 150° C. to 250° C. for photochemical oxidation and 250° C. to 300° C. for thermal oxidation. Such high temperatures can cause undesired diffusion within the semiconductor wafer, particularly resulting in diffusion of photoresist impurities into the device structures. Such high temperatures are unacceptable in many of today's integrated circuit manufacturing processes.

Removal of insoluble photoresist at lower temperatures, often below 100° C., can be achieved by "ashing" in an oxygen plasma. The plasma discharge required to effect such ashing, however, can itself result in damage to the wafer substrate. While attempts have been made to limit such damage by separating the plasma generation chamber from the treatment chamber, photoresist removal efficiency is significantly lowered with such designs. To compensate for such lower efficiency, the wafer temperature is often increased, again raising concerns over thermal damage.

Wet oxidative stripping of insoluble photoresists is also performed, typically using a sulfuric acid-hydrogen peroxide mixture referred to as a "piranha strip." Such wet stripping techniques, however, are generally ineffective at moderate temperatures and often require temperatures above 150° C. Frequently, wet stripping is performed only after an initial plasma ashing used to break through the upper region of the photoresist layer. In this way, the damage from the plasma can be minimized and the maximum temperature used during the wet stripping reduced. Such a combination of techniques, however, requires the use of separate reactors, is still rather slow, and uses relatively large amounts of wet chemicals.

For these reasons, it would be desirable to provide improved methods for removing (highly cross-linked) photoresist layers from semiconductor wafers. Such removal methods should be rapid. The methods should also reduce the amount of treatment chemicals required, both to decrease the cost of the process and to reduce contamination generated by the process.

The importance of overcoming the various deficiencies noted above is evidenced by the extensive technological development directed to the subject, as documented by the relevant patent and technical literature. The closest and apparently more relevant technical developments in the literature can be gleaned by considering: Moreau, *Semiconductor Lithography*, Plenum Press. 1988 © pp. 779–788, which describes photoresist stripping processes.

U.S. Pat. No. 5,201,960 (Starov) shows a method for removing photoresist and other adherent materials from substrates.

U.S. Pat. No. 5,362,608 (Flaim) Microlithographic substrate cleaning and compositions therefor—teaches using THFA (tetrahydrofurfuryl alcohol) as the active component of edge bead removal compositions.

U.S. Pat. No. 4,786,578 (Neisius) teaches that photoresist and stripper residues can be completely removed from substrates after the stripping process with an aqueous post-rinsing agent which contains a nonionogenic surfactant and an organic base.

U.S. Pat. No. 4,824,762 (Kobayashi) shows a post strip rinse and method. Kobayashi suggests that further advantages are obtained by adding an aliphatic amine compound to the rinse solvent.

U.S. Pat. No. 3,988,256 (Vandermey)—Photoresist stripper rinse—shows a process for removing a photoresist stripper from a substrate comprising rinsing the substrate.

SUMMARY OF THE INVENTION

Accordingly, it is an object of this invention to provide a stripping solution and process for stripping positive photoresist which will completely and reliably remove photoresist from a small keyhole.

It is another object of the invention to provide such a stripping solution and process which is usable with commonly used commercially available positive photoresists.

It is still another object of the invention to provide such a stripping solution and process for positive photoresist which is suitable for use in modern VLSI processing.

It is a further object of the invention to eliminate the need to use oxygen plasma equipment and processes to remove positive photoresist extrusions 24 and other difficult-to-remove polymeric materials formed after annealing processes.

It is still another object of the invention to provide an improved process for removing positive photoresist with a stripping liquid which makes the positive photoresist easier to remove.

These and related objects may be achieved through use of the novel stripping solution and process for stripping positive photoresist and other difficult to remove polymeric coatings from substrates herein disclosed. To accomplish the above objectives, the present invention provides a method for stripping photoresist (PR) residues 16 from a wafer and more particularly to a process for stripping photoresist residues 16 from a keyhole 17 in a passivation layer 18 before a heating process.

The invention's steps 3 and 4 use NMP which is preferably a major solvent of the photoresist stripper used in steps 1 and 2.

The process of the invention comprises:

(a) See FIG. 1—forming a metal pattern on the semiconductor structure 10; the metal pattern 14 having spaced metal lines 14;

(b) forming a passivation layer 18 over the metal pattern and forming a keyholes 17 in the passivation layer 18 between the spaced metal lines 14;

(c) applying, exposing and developing a photoresist pattern composed of a positive photoresist on the passivation layer 18; the photoresist pattern composed of a positive photoresist;

(c1) the photoresist residue 16 is comprised of: the positive photoresist, metals, silicon and ionic compounds;

(d) performing a first $O_2$ ashing treatment of the photoresist pattern;

(e) in a first strip step; treating the semiconductor structure with a first photoresist stripper in a first photoresist strip tank; the first photoresist stripper having a first solvent, the first photoresist stripper is comprised of 2,(-2 aminoethozy)ethanol; the first strip step performed for a time between 15 and 25 minutes at a temperature in a range of between about 90 and 110° C.;

(f) in a second strip step, treating the semiconductor structure with the first photoresist stripper in a second photoresist strip station; the second strip step performed for a time between 15 and 25 minutes at a temperature in a range of between about 90 and 110° C.;

(g) in a third strip step, treating the semiconductor structure with the first solvent while agitating the semiconductor structure in a third solvent tank;

(g1) the first solvent consists of N-methyl-2-pyrrolidone (NMP), Dimethyl formamide, butyrolactone, glycol ether, or glycol ether;

(g2) the third strip step performed for a time in a range of between about 20 second and 120 seconds and at a temperature between about 17 to 23° C.;

(h) in a fourth strip step, treating the semiconductor structure with the first solvent in a fourth solvent tank and agitating the semiconductor wafers;

(h1) the fourth strip step is preferably performed at a temperature between about 17 to 23° C.; for a time in a range of between about 20 and 120 seconds (i) in a fifth strip step, treating the semiconductor structure with a quick dump rinse in de-ionized water in a fifth rinse tank for a time in a range of between about 5 minutes and 20 minutes;

(j) Annealing the semiconductor structure 10, the five step strip process removing the residual photoresist from the keyhole thereby preventing the formation of a photoresist extrusion 24 on the passivation layer 18 during the heating of the semiconductor structure; See FIG. 2;

The invention is a photoresist stripping process that includes a NMP strip after a photoresist strip. A preferred embodiment of the process is summarized by the 5 steps below: (See FIG. 3)

| Step | Step | Composition - Brand names | Comments - important parameters |
|------|------|---------------------------|--------------------------------|
| 1 | Photoresist strip 1 | e.g., EKC 830 | dimethyl sulfoxide, sulfolane, dimethylformamide, dimethylacetamide; and 2,(-2 aminoethoxy)ethanol, NMP solvent |
| 2 | Photoresist strip 2 | e.g., EKC 830 | same as above - 2,(-2 aminothozy)ethanol; Removes photoresist pattern but not Photoresist residue 16 in keyhole |
| 3 | NMP solvent strip - agitated | 100% NMP | Removes residual photoresist 16 from Keyhole 17 |
| 4 | NMP solvent strip - agitated | 100% NMP | Removes residual photoresist 16 from Keyhole 17 |
| 5 | Quick dump rinse (QDR) | 100% $H_2O$ | |

The invention is especially able to remove positive photoresists from keyhole. The invention's steps 3 and 4 use NMP which is preferably a major solvent of the photoresist stripper used in steps 1 and 2.

The photoresist strip process using the solvent striper (e.g., NMP) of the present invention has the following benefits:

The photoresist residue 16 is completely removed from the keyhole 17 before heating processes thus eliminating photoresist extrusions 24 and improving yields.

Extruded photoresist 24 is eliminated after heating processes without expensive $O_2$ ashing processes.

The photoresist extrusion 24 only occurs at some specified positions such as where metal lines have 90° turns.

The photoresist extrusion 24 only can be seen after heating (metal annealing) processes.

The inventor's 2 solvent rinse stations 103 140 eliminated the photoresist extrusion problem 24 when implemented together with the steps 1, 2, and 5.

The (first) solvent used in the steps 3 &4 solvent rinses is preferably a solvent present in the photoresist. The solvent is preferably a major solvent of the photoresist stripper.

The same (first) solvent is preferably used in the Photoresist stripper (steps 1 & 2) and the solvent strip (steps 3& 4).

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 2 are cross sectional views for illustrating a method stripping photoresist using N-methyl-2-pyrrolidone (NMP) according to the present invention.

DETAILED DESCRIPTION OF THE PREFERRED EMBODIMENTS

Figure 3:
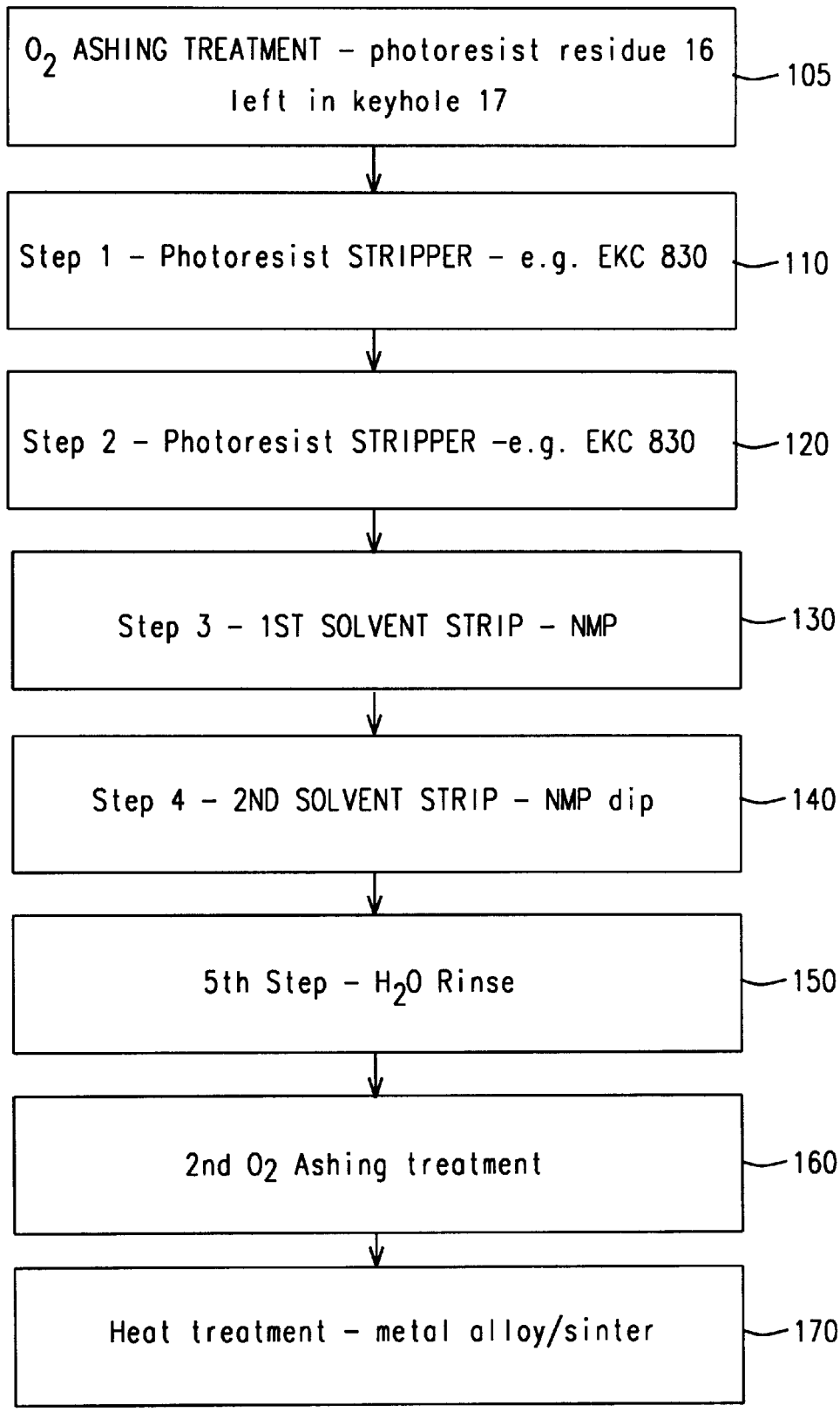
FIG. 3 is a flow chart of the process of the invention for stripping photoresist.

The present invention will be described in detail with reference to the accompanying drawings. The present invention provides a process for removing a photoresist pattern from a semiconductor structure. The invention is particularly designed to remove photoresist residue 16 from keyholes 17 before it is subjected heating. The invention is a photoresist stripping process that includes a 100% N-methyl-2-pyrrolidone (NMP) strip after a photoresist strip. A preferred embodiment of the process is summarized by the 5 steps shown in FIG. 3.

Problem of Photoresist Extrusion 24 Solved by the Invention's 5 Step Strip Process A major component of the invention is the discovery and recognition of the unknown "photoresist extrusion" 24 reliability problem. As shown in FIGS. 1 & 2, the inventor discovered that photoresist residues 16 left in keyholes 17 after subjected to anneal temperatures, form photoresist extrusions 24. The inventors found that these Photoresist extrusions 24 can be removed by $O_2$ ashing, but an extra sintering was required since $O_2$ ashing was a plasma process. It makes the reprocess consumptive. The inventors found that the photoresist extruding are hard compounds/polymers of the photoresist, silicon, metals and other ionic compounds. The problem is explained in more detail below.

The inventor has found a new major problem in removing photoresist from a wafer. In products that have tight spacing between structures, gaps, opening or keyholes 17 can form in between the tight spaces in passivation layers 18. These keyholes 17 can trap photoresist residues 16. The trapped photoresist residue 16 can cause reliability problems when the residue 16 is heated in subsequent metal anneal processes. The residual photoresist is "extruded" during subsequent heating steps to cause defects on the passivation layer 18 surface. The photoresist residue flows to surface of passivation layer 18 (extruded) and hardens. For example, as shown in FIG. 1, the inventor has found a "photoresist extrusion problem" 24 with photoresist 16 that is left in keyholes 17 in passivation layers 18 between conductive lines 14 on a semiconductor structure 10. As shown in FIG. 2, after the structure 10 is heated, to alloy the metal lines 14, the photoresist is extruded 24 on top of the passivation layer 18. The inventor has found that these photoresist extrusions 24 consist of polymers, metals, silicon and other contaminates, that collect in the keyholes. The photoresist extrusions 24 are extremely hard to remove. The inventor has found that it is possible to completely remove the photoresist extrusions with conventional $O_2$ Ashing processes, but an extra sintering was required since $O_2$ ashing was a plasma process. It makes the reprocess consumptive.

Because of the continual miniaturization of semiconductor devices and the increase sensitivity of the semiconductor devices to reliability problem, the inventor's recently discovered the "photoresist extraction" 24 problem. (See FIG. 2). With previous products, the Photoresist extrusion 24 problem may not have caused reliability problems, but with the inventors current product, reliability degradation form the Photoresist extrusion 24 is a major concern. This is especially true where the metal layer 14 is the top metal layer, the passivation layer 18 is the top passivation layer and the photolithography process is used to form bonding pad openings. A bonding pad metal is formed in the bonding pad openings. The inventors developed a 5 step photoresist strip process (See FIG. 3) to remove the photoresist residue 16 from the keyhole 17 thereby preventing the photoresist extrusion from forming. The 5 stage photoresist strip process gave unexpected good results in removing the photoresist residue from the keyholes. The inventor experimented with may other combinations of strip solutions and processes (e.g., $O_2$ ashing, Photoresist stripers, $H_2O$ rinses) but the present invention's 5 step strip process unexpectedly gave superior results. The invention's solvent stripper steps had a unexpected synergy with steps 1 & 2 and the keyholes having open dimensions in a range of between about 0.15 and 2.0 μm.

Example of Passivation Layer Formation and Photoresist Extrusion FIG. 2.

The table below summarizes a process for forming a passivation layer 18 with a photoresist extrusion 24:

| Step | Remarks |
| --- | --- |
| FIG. 1 - form A1 metal pattern 14 | |
| FIG. 1 - form passivation layer 18 having keyholes 17 | passivation layer composed of e.g., PSG (21K Å) and Silicon oxynitride (6.5K Å) |
| form positive photoresist layer - expose & develop to form photoresist pattern etch passivation layers 18 strip positive photoresist using $O_2$ ashing | Positive photoresist is e.g., JSR-7980G to form bond pad openings |
| Invention's 5 Step Photoresist Strip Process | |
| Removing the Photoresist residue 16 in keyhole 17 using the invention's 5 step photoresist strip process with NMP strips. 1) 1st photoresist strip 2) 2nd photoresist strip 3) 1st solvent strip - preferably 100% NMP 4) 2nd solvent strip - preferably 100% NMP 5) quick dump rinse in 100% $H_2O$ | See FIG. 3 - 5 steps |

The process is explained in more detail as follows. As shown in FIG. 1, a semiconductor structure 10 is provided. Semiconductor structure 10 is understood to possibly include a semiconductor wafer, active and passive devices formed within the wafer and layers formed on the wafer surface. The term "Semiconductor structure" is mean to include devices formed within a semiconductor wafer and the layers overlying the wafer.

Next, a metal pattern is formed on the semiconductor structure 10. The metal pattern 14 having spaced metal lines 14. The metal lines are closely spaced.

As shown in FIG. 1, a passivation layer 18 is formed over a pattern on a semiconductor structure 10. Keyholes 17 in are formed in tight spacer in the passivation layer 18. The passivation layer is preferably composed of silicon oxide, doped silicon oxide, phosphosilicate glass, silicon nitride, silicon nitride derivatives or silicon oxynitride. The passivation layer preferably has a thickness in a range of between about 10,000 and 29,000 Å. The passivation layer is preferably composed of a two layer structure comprising a PSG layer with a thickness in a range of between about 20,000 and 22,000 Å (or more preferably 21K Å+/−10%) and a Silicon oxynitride layer thickness in a range of between about 5000 and 8000 Å (or more preferably 6.5 K Å+/−10% thickness).

The keyhole 17 is where photoresist residue can be trapped. The inventor has found that keyholes with a open dimensions (e.g., largest width, height or diameter) in a range of between about 0.13 μm and 2.2 μm and more preferably between about 0.15 and 0.2 μm have a higher probability of forming Photoresist residues 16 within and are much harder to remove photoresist residues that do form therein. The invention's 5 step process is especially designed to remove photoresist residue from keyholes in this size range.

Next a photoresist layer (photoresist pattern) (not shown) is applied, exposed and developed over the passivation layer 18.

The photoresist pattern is preferably composed of a non-dye or dye positive photoresist. The photoresist is preferably a positive photoresist such as JSR-7980G, by Japanese Synthetic Rubber Co. Ltd., 2-11-24 Tsukiji Chuo-Ku, Tokyo, 104 Japan.

The composition and process of this invention is suitable for use with all of the commonly employed positive photoresists used in the semiconductor industry. Examples of suitable positive photoresists include Shipley 1325 and 1822 resists, MacDermid EPA 914 resist, Kodak 820 and 825 resists and Dyna-Chem Thiokol OFPR-800 resist, and JSR-790G and the like.

Positive photoresists are based on the use of a novolac matrix resin and, typically, a diazoquinone photoactive compound or sensitizer. Novolac resins are soluble in common organic solvents and are also soluble in aqueous base solutions by virtue of the acidic characteristic of their phenolic functionality. The diazoquinone derivatives are soluble in common organic solvents but are insoluble in aqueous bases. Upon exposure to light, these substances undergo a series of reactions that culminate in the formation of an indene carboxylic acid. The photoproduct, unlike its precursor, is extremely soluble in aqueous bases by virtue of its carboxylic acid functionality. These substances will react with transition and non-transition metals, such as phosphorous, arsenic, and antimony to create a vast chemistry of organometallic compounds.

The photoresist is exposed, developed in a conventional manner. The photoresist forms photoresist residues 16 in the keyholes 17. The photoresist residues are formed during wet process which left stripper solution in the keyhole.

Next, the passivation layer 18 is etched using the photoresist pattern as an etch mask to form opening such as bonding pad openings (not shown).This etch can be a RIE etch.

Referring to FIG. 3, the photoresist pattern is stripped, but the strip leaves a residual photoresist 17 in the keyhole 17. See FIG. 1.

The photoresist can be treated (stripped) in $O_2$ ashing process 105 before the invention's 5 step process.

5 Step Photoresist Strip Process Removes Photoresist Residue 16 in Keyhole 17

The photoresist residue 16 and any other remaining photoresist is now removed by the 5 step photoresist strip process of the invention 110 120 130 140 150 that uses solvent dip processes 130 140. The invention comprises a strip process preferably performed in 5 tanks/spray/rinse stations, 110 120 130 140 150. Table 1 summaries the major steps and chemical of the invention.

TABLE 1

SUMMARY OF 5 PHOTORESIST STRIP STEPS

| Step | Step | Composition - Brand names | preferred Chemical | Alternate chemical/compositions/ brand names |
|---|---|---|---|---|
|  | positive Photoresists that can be used with the invention | Positive Photoresist only | JSR-7980G - | Shipley 1325 and 1822 resists, MacDermid EPA 914 resist, Kodak 820 and 825 resists and Dyna-Chem Thiokol OFPR-800 resist- |
| 1 | Photoresist strip 1 | e.g., EKC 836 | 2,(-2 aminoethoxy) ethanol | N-methyl-2-pyrrolidone (NMP), Dimethyl sulfoxide, (DMSO) sulfolane, dimethlyformamide dimethylacetamide |
| 2 | Photoresist strip 2 | e.g., EKC 830 | 2,(-2 aminoethoxy) ethanol | N-4-2-pyrrolidone (NMP), Dimethoyl sulfoxide, sulfalane, dimethlyformamide, dimethylacetamide |
| 3 | NMP solvent strip - agitated | 100% NMP | N-methyl-2-pyrrolidone (NMP) | N-methyl-2-pyrrolidone (NMP), Dimethoyl sulfoxide, sulfolane, dimethylformamide, dimethylacetamide, Dimethyl formamide, butyrolactone, glycol ether, and glycol ether acetal; |
| 4 | NMP solvent strip - agitated | 100% NMP | N-methyl-2-pyrrolidone (NMP) |  |
| 5 | quick dump rinse - | 100% $H_2O$ | DI water |  |

Steps 1 and 2—Photoresist Striper

In the first and second Steps (110 & 120) the remaining photoresist pattern residual photoresist 16 is stripped in a wet strip preferably comprising aprotic solvents such as N-methyl-2-pyrrolidone (NMP), Dimethyl sulfoxide, (DMSO), sulfolane, dimethylformamide (DFM), dimethylacetamide (DMAC); 2,(-2 aminoethoxy)ethanol, sulfolane, dimethylformamide. The first photoresist stripper is preferably comprised an amine based additive, such as 2,(-2 aminoethoxy)ethanol and an aprotic solvent, such as N-methyl-2-pyrolidone (NMP).

The photoresist stripper can be a commercially available photoresist stripping solutions, preferably the Posistrip 830 solution, However, in many structure with tight spacers, some residual photoresist remains in spite of stripping efforts.

Stripping compositions utilizing various amine compounds for the removal of positive photoresist from semiconductor wafers having insulating and/or conductive patterns defined on their surfaces using the photoresist during the manufacture of integrated circuits are known in the art. For example, Posistrip 830, available from EKC Technology, Hayward, Calif. 94540, is the most aggressive commercially available stripper for positive photoresist. The principal active ingredient of Posistrip 830 is 2,(-2 aminoethoxy)ethanol.

Steps 1 and 2 are preferably perform in 2 sequential strip stations (e.g., tanks, spray, and rinse tools, etc., ). Herein, tanks can denote chemical stations with sophisticated control systems as used by those in the industry.

In one of the inventor's previous processes, at this point a $H_2O$ rinse was performed. However, this photoresist residue 16 still remained in the keyholes 17 and particularly in keyholes with open dimensions (e.g., largest width, height or diameter) in a range of between about 0.15 and 0.2 $\mu$m. The photoresist was polymeric and hydrophobic. The keyhole 17 also blocked the $H_2O$ spray from reaching the keyholes. As a result, the photoresist residue 16 remained.

Steps 3 and 4 the Invention's Solvent Strip (NMP)

Steps 3 and 4 (130 140) are solvent strip steps. See FIG. 3. Steps 3 & 4 involve a treating the semiconductor structure with N-methyl-2-pyrrolidone (NMP), dimethyl formamide, butyrolactone, glycol ether, or glycol ether acetal. In steps 3 and 4, the first solvent is most preferably N-methyl-2-pyrrolidone (NMP). The inventor has found that N-methyl-2-pyrrolidone (NMP) is superior at removing photoresist residue from keyholes 17.

The third and fourth strip steps 130 140 are preferably performed for a time in a range of between about 20 second and 120 seconds and at a temperature between about 17 to 23° C. The wafers 10 are preferably agitated.

It is preferred that the solvent in steps 3 and 4 is the same solvent that the photoresist stripper is comprised of (see steps 1 and 2). Most preferably the photoresist stripper is composed of NMP solvent and steps 3 &4 used 100% NMP solvent. This combination provided especially superior and unexpected good photoresist residue removal for keyholes with open dimensions (e.g., largest width, height or diameter) in a range of between about 0.15 and 0.2 $\mu$m. It is important to understand the solvent does not have to be the solvent in the photoresist. The solvent is preferably the solvent in the photoresist stripper.

Steps 3 and 4 are preferably the same and preferably have the same parameters.

Step 5—$H_2O$ Rinse (QDR)

Step 5 (150) involves treating the semiconductor structure with Quick Dump Rinse (QDR) in a 1st QDR station/tank for a time in a range of between about 5 minutes and 20 minutes. The QDR comprises spraying, rinsing and agitating the wafers in DI water.

After the 5 step strip process, an optional ashing step (e.g., $O_2$) can be performed.

Heat and Alloy Step

Next, semiconductor processing proceeds as normal (e.g., sintering metal and forming bonding pads etc.). As part of this processing, the structure is subjected to a heating process. With strip processes, other than the invention's 5 step strip process, the heating forces any remaining residual photoresist 16 from the keyhole 17 on a top surface of the passivation layer 18 thus forming a photoresist extrusion 24 on the passivation layer 18. See FIG. 2. The invention's 5 step strip process eliminates the photoresist residue 16 before the alloy heating step to prevent the photoresist extrusion problem 24.

The heating preferably comprising heating the semiconductor to a temperature above 400° C. The heating preferably comprising heating said semiconductor to a temperature between about 400 and 500° C. and for a time in a range of between about 10 and 30 minutes. Heating to this temperature range has be shown to produce photoresist extrusions 24 that can't be removed using standard ashing or photoresist stripping processes and cause reliability problems. The inventors have found that once a photoresist extrusion is heated above about 400° C. an intensive extra $O_2$ ashing can remove the photoresist extrusion. However, since the plasma process can cause underlayer Vt shift issue, an additional metal sintering was also needed. This would make the process more consumptive and less desirable.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to than understanding of the present if invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A process for removing photoresist residue from a semiconductor structure comprising:

(a) forming a metal pattern on said semiconductor structure; said metal pattern having spaced metal lines;

(b) forming a passivation layer over said metal pattern and forming a keyhole in said passivation layer between said spaced metal lines;

(c) applying, exposing and developing a photoresist pattern composed of a positive photoresist on said passivation layer; and forming a photoresist residue in said keyhole; said photoresist pattern composed of a positive photoresist;

(d) etching said passivation layer using said photoresist pattern as an etch mask to form first openings in said passivation layer;

(e) in a first strip step; treating the semiconductor structure with a first photoresist stripper in a first photoresist strip station; said first photoresist stripper comprised of a first solvent;

(f) in a second strip step, treating the semiconductor structure with said first photoresist stripper in a second photoresist strip station;

(g) in a third strip step, treating said semiconductor structure with said first solvent while agitating said semiconductor structure in a third solvent station;

(h) in a fourth strip step, treating the semiconductor structure with said first solvent in a fourth solvent station and agitating said semiconductor structure; and (i) in a fifth strip step, treating the semiconductor structure with a quick dump rinse in de-ionized water in a fifth rinse station.

2. The method of claim 1 wherein further includes: sintering said semiconductor structure, whereby the five step strip process removes said residual photoresist from said keyhole thereby preventing the formation of a photoresist extrusion on said passivation layer during the heating of said semiconductor structure.

3. The method of claim 1 wherein said first solvent consists of a chemical selected from the group consisting of N-Methyl-2-pyrrolidone (NMP), dimethyl formamide, butyrolactone, glycol ether, and glycol ether acetal.

4. The method of claim 1 after step (i) which further includes: treating said passivation layer with a second $O_2$ ash treatment.

5. The method of claim 1 wherein said passivation layer is the top passivation layer and said first opening are bonding pad openings.

6. The method of claim 1 wherein said keyholes have an open dimension in a range of between about 0.15 and 2.0 $\mu$m.

7. The method of claim 1 wherein said photoresist residue comprised of: said positive photoresist, metals, silicon and ionic compounds.

8. The method of claim 1 wherein said first photoresist stripper is comprised an amine based additive and a aprotic solvent.

9. The method of claim 1 wherein said first photoresist stripper is comprised a chemical selected from the group consisting of 2,(-2 aminoethoxy)ethanol, N-Methyl-2-pyrrolidone (NMP), Dimethoyl sulfoxide, sulfolane, dimethylformamide, and dimethylacetamide.

10. The method of claim 1 wherein said first solvent is N-Methyl-2-pyrrolidone (NMP).

11. A process for removing photoresist residue from a semiconductor structure comprising:

(a) forming a metal pattern on said semiconductor structure; said metal pattern having spaced metal lines;

(b) forming a passivation layer over said metal pattern and forming a keyholes in said passivation layer between said spaced metal lines;
  (b1) said keyholes have an open dimension in a range of between about 0.15 and 2.0 $\mu$m;
  (b2) said passivation layer composed of a material selected from the group consisting of silicon oxide, doped silicon oxide, phosphosilicate glass, silicon nitride, and silicon oxynitride;

(c) applying, exposing and developing a photoresist pattern composed of a positive photoresist on said passivation layer; and forming a photoresist residue in said keyhole; said photoresist pattern composed of a positive photoresist;
  (c1) said photoresist residue comprised of: said positive photoresist, metals, silicon and ionic compounds;

(d) etching said passivation layer using said photoresist pattern as an etch mask to form first openings in said passivation layer;

(e) performing a first ashing treatment of said photoresist pattern leaving said residual photoresist in said keyhole;

(f) in a first strip step; treating the semiconductor structure with a first photoresist stripper in a first photoresist strip station;
  (f1) said first photoresist stripper is comprised a chemical selected from the group consisting of amine based additives and aprotic based solvents; said first photoresist stripper comprised of a first solvent;
  (f2) said first strip step performed for a time between 15 and 25 minutes at a temperature in a range of between about 90 and 110° C.;

(g) in a second strip step, treating the semiconductor structure with said first photoresist stripper in a second photoresist strip station;
  (g1) said second strip step performed for a time between 15 and 25 minutes at a temperature in a range of between about 90 and 110° C.;
  (g2) in a third strip step, treating said semiconductor structure with said first solvent while agitating said semiconductor structure in a third solvent station; said first solvent is N-Methyl-2-pyrrolidone (NMP);

(h) in a fourth strip step, treating the semiconductor structure with said first solvent in a fourth solvent station and agitating said semiconductor structure;

(i) in a fifth strip step, treating the semiconductor structure with a quick dump rinse in de-ionized water in a fifth rinse station for a time in a range of between about 5 minutes and 20 minutes;

(j) heating said semiconductor structure, the five step strip process removing said residual photoresist from said keyhole thereby preventing the formation of a photoresist extrusion on said passivation layer during the heating of said semiconductor structure; and (k) the heating of said semiconductor structure comprising heating said semiconductor structure to a temperature between about 400 and 500° C. and for a time in a range of between about 10 and 30 minutes.

12. The method of claim 11 which further includes after step (1), treating said passivation with a second ashing treatment.

13. The method of claim 11 wherein said passivation layer is the top passivation layer and said first openings are bonding pad openings.

14. The method of claim 11 wherein said first photoresist stripper is comprised a chemical selected from the group consisting of 2,(-2 aminoethoxy)ethanol, N-Methyl-2-pyrrolidone (NMP), Dimethoyl sulfoxide, sulfolane, dimethylformamide, and dimethylacetamide.

15. A process for removing photoresist residue from a semiconductor structure comprising:

(a) forming a metal pattern on said semiconductor structure; said metal pattern having spaced metal lines;

(b) forming a passivation layer over said metal pattern and forming a keyhole in said passivation layer between said spaced metal lines;
  (b1) said passivation layer composed of a material selected from the group consisting of silicon oxide, doped silicon oxide, phosphosilicate glass, silicon nitride, and silicon oxynitride; and having a thickness in a range of between about 10,000 and 29,000 Å;

(c) applying, exposing and developing a photoresist pattern composed of a positive photoresist on said passivation layer; and forming a photoresist residue in said keyhole; said photoresist pattern composed of a positive photoresist;
   (c1) said photoresist residue comprised of: said positive photoresist, metals, silicon and ionic compounds;
(d) etching said passivation layer using said photoresist pattern as an etch mask to form first openings in said passivation layer;
(e) performing a first $O_2$ ashing treatment of said photoresist pattern;
   (e1) the $O_2$ ashing of said photoresist pattern is performed for between about 40 and 80 minutes;
(f) in a first strip step; treating the semiconductor structure with a first photoresist stripper in a first photoresist strip station; said first photoresist stripper having a first solvent comprised of N-Methyl-2-pyrrolidone (NMP);
   (f1) said first photoresist stripper is comprised a chemical selected from the group consisting of 2,(-2 aminoethoxy)ethanol, N-Methyl-2-pyrrolidone (NMP), Dimethyl sulfoxide, (DMSO), sulfolane, dimethylformamide, and dimethylacetamide (DMAC);
   (f2) said first strip step performed for a time between 15 and 25 minutes at a temperature in a range of between about 90 and 110° C.;
(g) in a second strip step, treating the semiconductor structure with said first photoresist stripper in a second photoresist strip station;
   (g1) said second strip step performed for a time between 15 and 25 minutes at a temperature in a range of between about 90 and 110° C.;
(h) in a third strip step, treating said semiconductor structure with said first solvent while agitating said semiconductor structure in a third solvent station;
   (h1) said third strip step performed for a time in a range of between about 20 second and 120 seconds and at a temperature between about 17 to 23° C.;
(i) in a fourth strip step, treating the semiconductor structure with said first solvent in a fourth solvent station and agitating said semiconductor structure;
   (i1) said fourth strip step performed at a temperature between about 17 to 23° C.; for a time in a range of between about 20 and 120 seconds;
(j) in a fifth strip step, treating the semiconductor structure with a quick dump rinse in de-ionized water in a fifth rinse station for a time in a range of between about 5 minutes and 20 minutes;
(k) heating said semiconductor structure 10, the five step strip process removing said residual photoresist from said keyhole thereby preventing the formation of a photoresist extrusion on said passivation layer during the heating of said semiconductor structure;
(l) the heating of said semiconductor structure comprising heating said semiconductor structure to a temperature between about 400 and 500° C. and for a time in a range of between about 10 and 30 minutes.

16. The method of claim 15 wherein said passivation layer is the top passivation layer and said first openings are bonding pad openings.

\* \* \* \* \*